United States Patent [19]

Keller

[11] Patent Number: 4,900,887
[45] Date of Patent: Feb. 13, 1990

[54] FLOATING ZONE DRAWING CIRCUITRY FOR SEMICONDUCTOR RODS

[75] Inventor: Wolfgang Keller, Munich, Fed. Rep. of Germany

[73] Assignee: Siemens Aktiengesellschaft, Berlin and Munich, Fed. Rep. of Germany

[21] Appl. No.: 322,749

[22] Filed: Mar. 13, 1989

Related U.S. Application Data

[63] Continuation-in-part of Ser. No. 48,193, May 11, 1987, abandoned.

[30] Foreign Application Priority Data

May 16, 1986 [DE] Fed. Rep. of Germany ....... 3616595

[51] Int. Cl.⁴ .............................................. H05B 6/08
[52] U.S. Cl. ............................. 219/10.77; 219/10.43; 373/139
[58] Field of Search ............... 219/10.75, 10.77, 10.43; 373/139, 147, 148

[56] References Cited

U.S. PATENT DOCUMENTS

| | | | |
|---|---|---|---|
| 2,964,608 | 12/1960 | MacLean | 219/10.75 |
| 3,046,379 | 7/1962 | Keller et al. | 219/10.43 X |
| 3,270,177 | 8/1966 | Prediger et al. | 373/139 X |
| 3,718,852 | 2/1973 | Bailey | 219/10.77 X |
| 3,985,947 | 10/1976 | Keller | 219/10.75 |
| 4,356,371 | 10/1982 | Kiuchi et al. | 219/10.77 |
| 4,392,230 | 7/1983 | Keller et al. | 373/139 |

FOREIGN PATENT DOCUMENTS

| | | | |
|---|---|---|---|
| 273906 | 3/1979 | Fed. Rep. of Germany | 219/10.43 |
| 3616595 | 11/1987 | Fed. Rep. of Germany | 219/10.43 |
| 1027954 | 5/1966 | United Kingdom | 219/10.43 |

Primary Examiner—Philip H. Leung
Attorney, Agent, or Firm—John Francis Moran

[57] ABSTRACT

For floating zone drawing of semiconductor rods having diameters greater than 100 mm, at the beginning of the zone drawing process, in particular during melting on of the seed crystal to the semiconductor rod to be drawn, a high load change and impedance change occurs. The power from the high-frequency (HF) generator is no longer coupled thereto optimally. Heating up the feed line to the induction heating coil is the result. This heating is avoided by connecting the HF generator via a feed line to a tank circuit device. A variable tank circuit capacitor connected in parallel and to the series oscillator circuit coil feeding one side of a parallel circuit of a heating circuit capacitor and the induction heating coil. The variable oscillator circuit capacitor is adjusted as a function of the voltage drop across the induction heating coil.

4 Claims, 1 Drawing Sheet

FLOATING ZONE DRAWING CIRCUITRY FOR SEMICONDUCTOR RODS

Cross-reference to a related application

The present application is a continuation-in-part of copending application Ser. number 07/048,193 filed May 11, 1987, now abandoned, which is incorporated herein by reference.

The invention relates to circuitry for floating zone drawing of semiconductor rods employing a resonant circuit, and it relates, more particularly, to such a circuit having two input terminals fed and locally isolated from an HF generator via a feed line. The circuit includes a parallel heating oscillator circuit comprising a heating circuit capacitor and an induction heating coil connected to a reference potential.

Such circuit configurations are disclosed, for example, in U.S. Pat. No. 3,270,177 and 3,985,947. In these conventional circuit configurations, a high-frequency ac voltage is supplied via a feed line from the HF generator to the parallel heating oscillator circuit and consequently to the induction heating coil. The high-frequency ac voltage coupling for this purpose in U.S. Pat. No. 3,985,947 is inductive and in U.S. Pat. No. 3,270,177 is capacitively coupled out of the HF generator oscillator circuit connected via a coupling capacitor and applied at the feed line.

In this known type of line feed to the parallel heating circuit, a significant problem exists, however, in that the feed (in general a coaxial cable) is strongly heated up with large load changes. Those skilled in the art have had to go so far due to this heating problem by providing the feed with a special cooling device in order to avoid damage to it. This elaborate cooling of the feed line is extremely cumbersome and requires as disclosed in U.S. Pat. No. 3,985,941 a specially designed feed line.

The load change is greatest at the beginning of the zone drawing process. The main reason is that during the fabrication of monocrystalline semiconductor rod from a polycrystalline semiconductor rod initially requires a monocrystalline seed crystal rod whose diameter is smaller by multiples than the rod and must be fused to the semiconductor rod. A diameter of the melting zone only gradually growing in size and hence becoming conically thicker is given and, specifically, to the desired diameter of, for example, more than 100 mm. With increasing load and consequently increasing diameter of the melt zone, the inductance of the induction heating coil, however, decreases and, hence, also the Q factor of the heating parallel oscillator circuit. A significant change of the current through the therefrom resulting mismatch of the feed line to the heating parallel oscillator circuit is the consequence. The feed line heats considerably.

Indeed in German patent document DE-OS 29 38 348, a circuit configuration is described which is non-critical to load changes and additionally diminishes the occurrence of voltage flashover or arcing in the area of the induction heating coil. To this end, this circuit arrangement has an oscillator circuit configuration coupled to the HF generator via a coupling capacitor which comprises an oscillator circuit capacitor and a series circuit of oscillator circuit coil and induction heating coil. The oscillator circuit coil has a large inductance in comparison to the induction heating coil. In addition, a heating circuit capacitor presenting a relatively large capacitance is connected in parallel to the induction heating coil. The value of this heating circuit capacitor is such that its resonance frequency $f_s$ deviates maximally by the factor of two from the frequency $f_p$ of the HF generator which can lie between 1 and 5 MHz. However information concerning the configuration and design of a feed line between the HF generator and the induction heating coil, is not indicated in this document DE-OS 29 38 348.

SUMMARY OF THE INVENTION

An object of the invention is to provide a circuit configuration in which the power loss on the feed line to the heating parallel oscillator circuit can be kept as low as possible even during zone drawing of semiconductor rods greater than 100 mm and consequently completely obviates the need for elaborate cooling of the feed line.

The invention takes the form of a floating zone drawing circuit for semiconductor rods including an oscillator having two input terminals (b, b') for receiving radio frequency energy, a highfrequency generator, a feed line connected between the two input terminals and the high-frequency generator for providing the radio frequency energy while providing isolation therebetween. The oscillator is a parallel heating circuit comprising a heating circuit capacitor, and an induction heating coil connected to reference potential. The oscillator circuit capacitor is arranged in parallel to a series circuit of an oscillator circuit coil and the heating parallel tank circuit between the input terminals (b, b') of the oscillator circuit device (T). The inductance of the tank circuit coil is greater than the inductance of the induction heating coil, while the capacitance of the tank circuit capacitor is variable. A controller for changing the value of the tank circuit capacitor is responsive to a voltage potential decrease across the induction heating coil.

In some of the further aspects of this invention, the value of the capacitance of the heating circuit capacitor is selected so that the resonance frequency ($f_s$) of the parallel heating tank circuit maximally deviates a factor of two from the frequency ($f_p$) of the tank circuit configuration (T). The variable tank circuit capacitor is adjusted so that the impedance at the terminals (b, b') of the tank circuit device (T) can be maintained at least nearly constant. The output power of the high frequency generator is variable.

The implementation according to the invention of the oscillator circuit device connected to the feed line is structurally known from DE-OS 29 38 348. The arrangement of the feed line between the coupling capacitor and the oscillator circuit device alone has, however, not lead to a satisfactory result with respect to good efficiency and optimum coupling of the anode ac voltage out from the heating parallel oscillator circuit [sic] in the case of semiconductor rods with diameters greater than 100 mm. Only the implementation of the oscillator circuit capacitor, according to the invention additionally variable, and its adjustment as a function of the voltage decreasing at the induction heating coil leads to the solution of the task according to the invention.

BRIEF DESCRIPTION OF THE DRAWING

Features of the invention and additional objects of the invention will be more readily appreciated and better understood by reference to the following detailed description which should be considered in conjunction with the drawing.

In FIG. 1 the circuit configuration includes a HF generator 1, symbolically represented only as a triode for the sake of simplicity, whose output is connected via a coupling capacitor 2 and applied to two output terminals a, a'. A feed line 10 connected to these output terminals a, a', in general a coaxial cable, connects the HF generator 1 with input terminals b, b' of an oscillator circuit device T. The terminals a', b' are at reference or ground potential. In the oscillator circuit device T, a parallel oscillator circuit is connected to the input terminals b, b' which comprises an oscillator circuit capacitor 3 with variable capacitance and a series circuit of an oscillator circuit coil 4 and an induction heating coil 5. The inductance of the oscillator circuit coil 4 is greater than the inductance of the induction heating coil 5 which can be implemented, for example, as a single-wound, slotted, rotationallysymmetric hollow body. Parallel to the induction heating coil 5, a heating circuit capacitor 6 is connected with relatively large capacitance. The capacitance of the heating circuit capacitor 6 has a value such that the resonance frequency $f_s$ of the heating parallel circuit 11 deviates maximally by the factor 2 from the operating frequency $f_p$ of the HF generator 1. The operating frequency $f_p$ of the HF generator 1 is determined essentially from the values of the oscillator circuit capacitor 3 as well as the series circuit of the oscillator circuit coil 4 and the induction heating coil 5.

Figure 1:
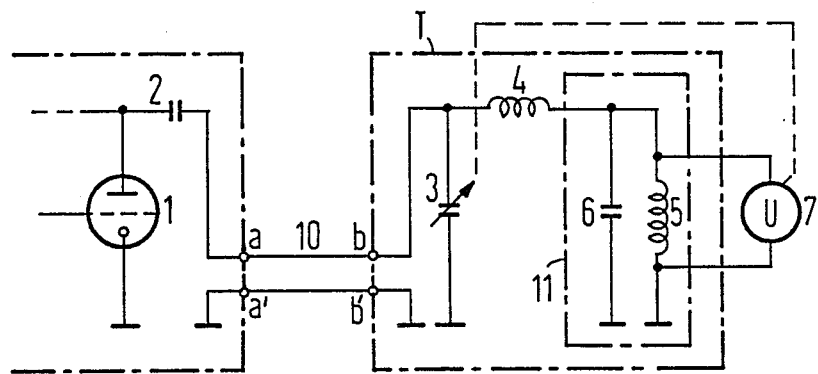
FIG. 1 illustrates a circuit configuration in accordance with the invention wherein an induction heating coil is grounded at one end.

Through the arrangement of the feed line 10 according to the invention between coupling capacitor 2 of the HF generator 1 and oscillator circuit device T, it is effectively avoided that the feed line carries high current at high power. Feed line 10 leads to the high impedance oscillator circuit device T which is connected with the induction heating coil in a structural unit. A lower current on the feed line and, consequently, less heating up of it is the result.

Changing the melt zone load and hence the inductance of the induction heating coil 5 in the course of the floating zone drawing and, in particular, at the beginning of the zone drawing process brings about a different frequency response for the two-terminal reactance network function with respect to the terminals b, b'. Maximum power matching is possible if the output resistance of the HF generator 1 is transformed to its load resistance. The change of the inductance of the induction heating coil 5 effects, however, a change of the terminal resistance and, hence, a mismatch. In order to be able to keep this mismatch as low as possible even with large rod diameters it is provided according to the invention to compensate the inductance change of the induction heating coil 5 with a suitable adjustment of the capacitance value of the oscillator circuit capacitor 3.

Changing the capacitance of the heating circuit capacitor 6 would theoretically also effect a compensation of the inductance change of the induction heating coil 5. But for practical reasons (the capacitance of the heating circuit capacitor 6 must lie in the $10^{-8}$ farad range and hence is not realizable as a variable capacitor) it cannot be carried out.

During operation of the circuit configuration according to the invention in practice means are provided for adjusting the oscillator circuit capacitor 3 as a function of a voltage decrease at the induction heating coil 5. These means can be realized, for example, from a voltage meter 7 which is connected in parallel to the induction heating coil 5 and upon load change indicates a voltage drop relative to the no-load state. Depending on this measured voltage value the capacitance of the oscillator circuit capacitor 3 can be readjusted manually or by motor and consequently an optimum power matching can be achieved.

In order to have available a high power range at the induction heating coil 5 it is additionally possible to make the output voltage of the HF generator 1 variable. This can take place, for example, through a thyristor controller for the anode voltage of the HF end stage tube.

Figure 2:
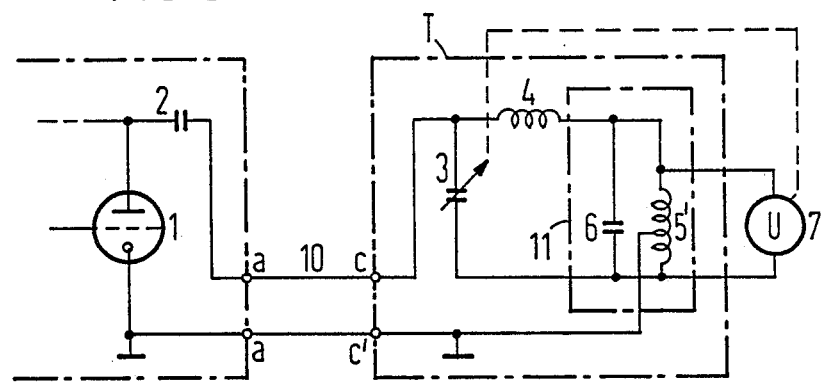
FIG. 2 is another circuit configuration according to the principles of the invention wherein the induction heating coil grounded at the center.

In FIG. 2 a second embodiment example is represented which differs from the circuit configuration according to FIG. 1 in so far as the induction heating coil 5' now is grounded at the coil center. For the remainder the circuit configuration in FIG. 3 is the same as the circuit configuration of FIG. 1. For convenience, the same reference numerals are used to designate substantially identical circuit elements.

For the sake of simplicity and greater clarity, for detailed representation of the feedback in FIGS. 1 and 2 was omitted. For reasons of stability of the circuit configuration it should be taken into consideration that the circuit elements 3, 4, 5, and 6 must have preselected values so that the second pole frequency of the oscillator circuit device T has no feedback operation.

There has thus been shown and described novel powering arrangements for circuitry for providing float zone drawing of semiconductor material which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

I claim:

1. A circuit for float zone drawing of semiconductor rods, the circuit comprising:

a high-frequency generator having an output;

a coupling circuit connected to the output of the high-frequency generator, the coupling circuit comprising a variable capacitor connected to the output and a series coupling coil connected between the output and a parallel heating circuit, the series coupling coil inductively coupling the output of the high-frequency generator to the parallel heating circuit, the heating circuit comprising an inductive heating coil and a heating capacitor connected in parallel to each other, the heating coil having an inductance and the series coupling coil having an inductance larger than the inductance of the heating coil, the coupling circuit capacitor being variable in capacitance, and means for adjusting the variable capacitor responsive to a voltage potential directly across the inductive heating coil to compensate for a change in value of the inductance of the heating coil to avoid a mismatch between the output of the high-frequency generator and the coupling circuit.

2. The circuit of claim 1, wherein the series coupling coil has an inductance which is much larger than the inductance of the inductive heating coil, and wherein the capacitance of the heating capacitor is fixed and sufficiently larger that the inductive heating coil and heating capacitor resonate at a frequency which is at most twice the frequency of the high-frequency generator.

3. The circuit of claim 1, wherein the means for adjusting the variable capacitor in accordance with the voltage potential in a manner that the impedance across the output of the high frequency generator is maintained substantially constant.

4. The circuit of claim 1, wherein the high-frequency generator is adjustable in such a manner as to vary its output voltage.

* * * * *